(12) United States Patent
Restrepo et al.

(10) Patent No.: US 11,538,815 B2
(45) Date of Patent: Dec. 27, 2022

(54) NON-VOLATILE MEMORY CELL ARRAYS WITH A SECTIONED ACTIVE REGION AND METHODS OF MANUFACTURING THEREOF

(71) Applicant: GLOBALFOUNDRIES U.S. Inc., Santa Clara, CA (US)

(72) Inventors: Oscar D. Restrepo, Clifton Park, NY (US); Edmund K. Banghart, Pittsford, NY (US); William Taylor, Clifton Park, NY (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 21 days.

(21) Appl. No.: 16/935,691

(22) Filed: Jul. 22, 2020

(65) Prior Publication Data
US 2022/0028873 A1 Jan. 27, 2022

(51) Int. Cl.
*H01L 27/112* (2006.01)
*H01L 29/66* (2006.01)
(Continued)

(52) U.S. Cl.
CPC .... *H01L 27/11206* (2013.01); *H01L 27/0211* (2013.01); *H01L 27/1052* (2013.01);
(Continued)

(58) Field of Classification Search
CPC ..... H01L 21/823431; H01L 21/823821; H01L 21/845; H01L 27/0886; H01L 27/0924; H01L 27/1211; H01L 27/10826; H01L 27/10879; H01L 29/41791; H01L 29/66795–66818; H01L 29/785–7856; H01L 2029/7857–7858; H01L 2924/13067; H01L 27/0207; H01L 27/0211; H01L 27/11206; H01L 27/1052; H01L 29/0684; H01L 29/0692
See application file for complete search history.

(56) References Cited

U.S. PATENT DOCUMENTS 8,219,951 B2  7/2012 Cheng et al.
8,527,918 B2  9/2013 Cheng et al.
(Continued)

OTHER PUBLICATIONS

F. Khan, E. Cartier, C. Kothandaraman, J. C. Scott, J. C. S. Woo and S. S. Iyer, "The Impact of Self-Heating on Charge Trapping in High-k-Metal-Gate nFETs," in IEEE Electron Device Letters, vol. 37, No. 1, pp. 88-91, Jan. 2016, doi: 10.1109/LED.2015.2504952.

*Primary Examiner* — Younes Boulghassoul
(74) *Attorney, Agent, or Firm* — Thompson Hine LLP

(57) ABSTRACT

Structures for an array of non-volatile memory cells and methods of forming a structure for an array of non-volatile memory cells. An active region of a substrate includes a first section having a side edge and a second section extending laterally from the side edge. The first section of the active region has a first length dimension in a direction parallel to the first side edge. The second section has a second length dimension in the direction parallel to the first side edge. The second length dimension is less than the first length dimension. A fin is positioned on the substrate in the second section of the active region. A gate structure extends over the fin and the second section of the active region.

20 Claims, 11 Drawing Sheets

(51) Int. Cl.
*H01L 29/78* (2006.01)
*H01L 27/02* (2006.01)
*H01L 27/105* (2006.01)
*H01L 29/06* (2006.01)

(52) U.S. Cl.
CPC ...... *H01L 29/0684* (2013.01); *H01L 29/0692* (2013.01); *H01L 29/66545* (2013.01); *H01L 29/66795* (2013.01); *H01L 29/7851* (2013.01); *H01L 29/785* (2013.01)

(56) References Cited

U.S. PATENT DOCUMENTS

| | | |
|---|---|---|
| 8,928,110 B2 | 1/2015 | Lien et al. |
| 9,235,677 B1 | 1/2016 | Chang et al. |
| 10,510,599 B2 * | 12/2019 | Sio ................. H01L 21/823431 |
| 2010/0019329 A1 | 1/2010 | Poon et al. |
| 2012/0278777 A1 * | 11/2012 | Lin ....................... G06F 30/398 716/111 |
| 2015/0179529 A1 | 6/2015 | Chen et al. |
| 2015/0303193 A1 * | 10/2015 | Shen ............... H01L 21/823437 438/10 |
| 2016/0225763 A1 * | 8/2016 | Jain .................... H01L 27/0886 |
| 2017/0301586 A1 * | 10/2017 | Sio ................. H01L 21/823475 |
| 2018/0096999 A1 * | 4/2018 | Zhou ................. H01L 21/76232 |
| 2020/0243523 A1 * | 7/2020 | Lee ..................... H01L 29/0646 |

* cited by examiner

NON-VOLATILE MEMORY CELL ARRAYS WITH A SECTIONED ACTIVE REGION AND METHODS OF MANUFACTURING THEREOF

BACKGROUND

The present invention relates to integrated circuits and semiconductor device fabrication and, more specifically, to structures for an array of non-volatile memory cells and methods of forming a structure for an array of non-volatile memory cells.

Non-volatile memories are utilized in various electronic products, such as cellular telephones. One-Time-Programmable (OTP) memory and Multiple-Time-Programmable (MTP) memory are common types of non-volatile memories. A major difference between these types of non-volatile memory is that a Multiple-Time-Programmable memory is capable of being repeatedly programmed and erased, which contrasts with a One-Time-Programmable memory that can only be programmed a single time.

A cell array for a Multiple-Time-Programmable memory may be constructed based on a device structure for a fin-type field-effect transistor (FinFET). A fin-type field-effect transistor may include one or more fins, one or more gate structures that wrap about the fins, and heavily-doped source/drain regions epitaxially grown from the fins.

A Multiple-Time-Programmable memory relies on self-heating via Joule heating to reduce capture and emission lifetimes so that programming and erasing of stored electrical charges can be achieved within a reasonable timescale. A high level of temperature uniformity is desired among all memory cells in an array so that statistical margins for recording bits of data can be minimized. High operational voltages may provide the needed statistical margins but may reduce temperature uniformity across the cell array, as well as produce electrical defects from gate dielectric breakdown and electromigration.

Improved structures for an array of non-volatile memory cells and methods of forming a structure for an array of non-volatile memory cells are needed.

SUMMARY

According to an embodiment of the invention, a structure includes a substrate having an active region. The active region includes a first section having a side edge and a second section extending laterally from the side edge. The first section of the active region has a first length dimension in a direction parallel to the first side edge. The second section has a second length dimension in the direction parallel to the first side edge. The second length dimension is less than the first length dimension. A fin is positioned on the substrate in the second section of the active region. A gate structure extends over the fin and the second section of the active region.

According to another embodiment of the invention, a method includes forming a trench isolation region in a substrate to define a boundary for an active region. The active region includes a first section having a side edge and a second section extending laterally from the side edge. The first section of the active region has a first length dimension in a direction parallel to the first side edge. The second section has a second length dimension in the direction parallel to the first side edge. The second length dimension is less than the first length dimension. The method further includes forming a fin positioned on the substrate in the second section of the active region, and forming a gate structure that extends over the fin and the second section of the active region.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
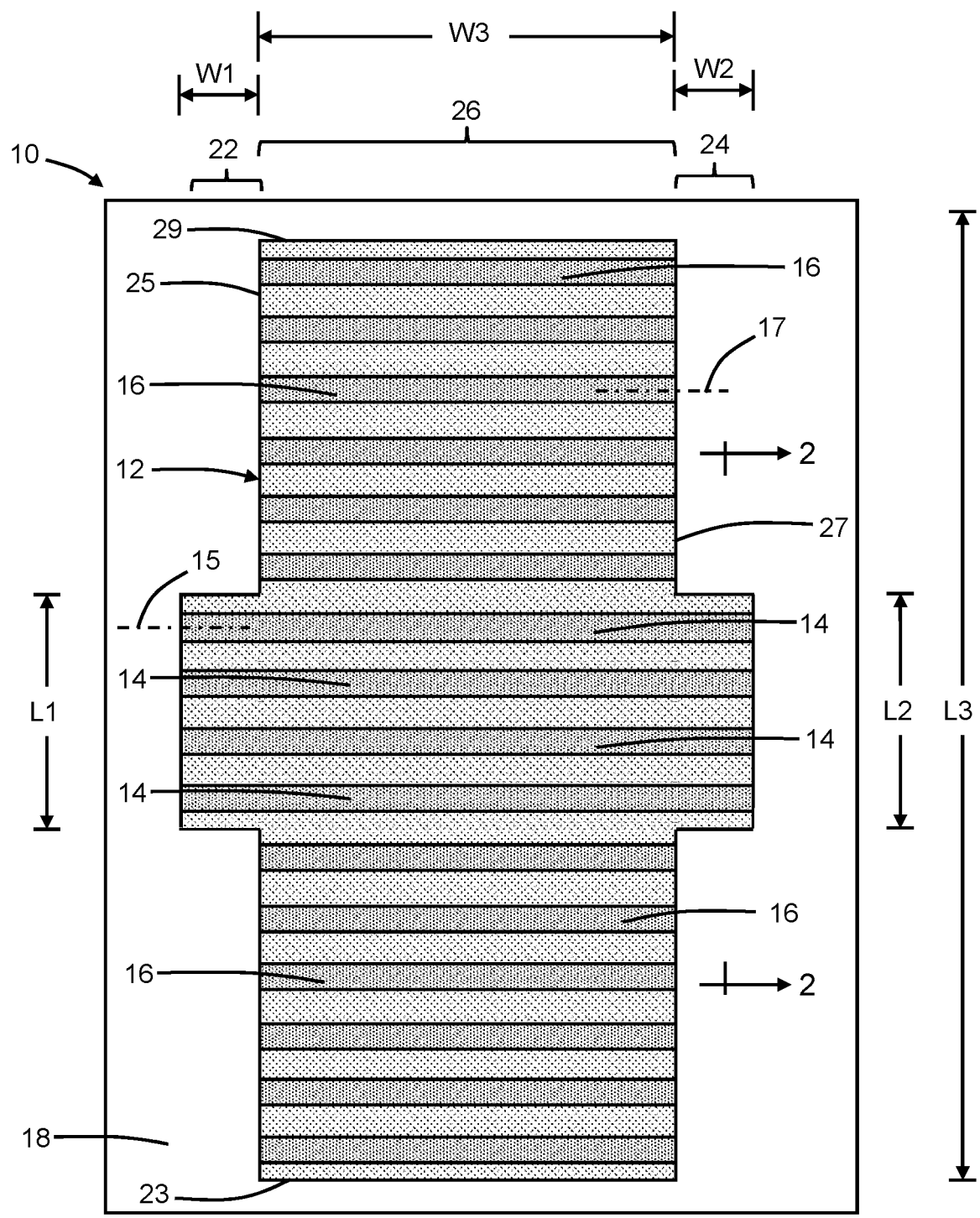
FIG. 1 is a top view of a non-volatile memory structure at an initial stage of a processing method in accordance with embodiments of the invention.
Figure 2:
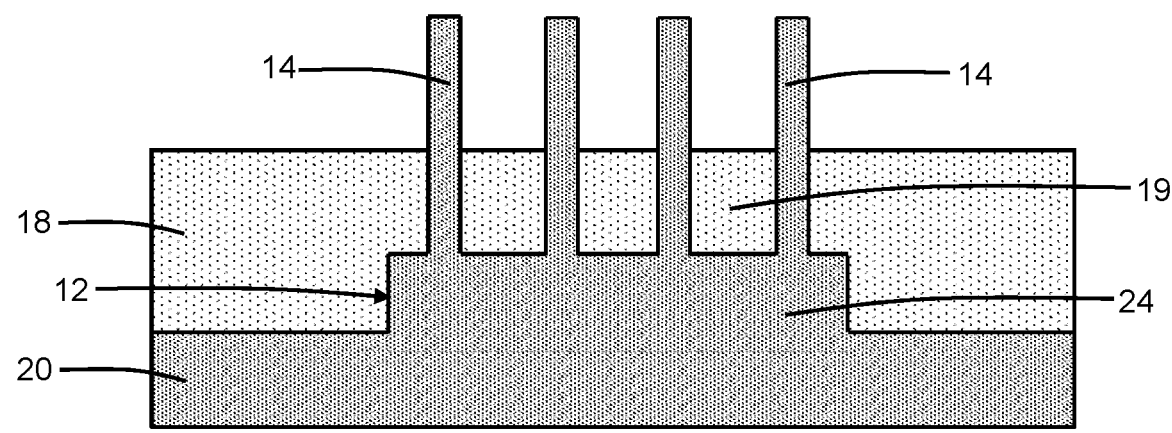
FIG. 2 is a cross-sectional view taken generally along line 2-2 in FIG. 1.

With reference to FIGS. 1, 2 and in accordance with embodiments of the invention, a structure 10 for an array of non-volatile memory cells includes an active region 12, fins 14, and fins 16. A trench isolation region in the form of a deep trench isolation region 18 is formed in a substrate 20 and surrounds the active region 12. Shallow trench isolation 19 is formed in the active region 12 between the fins 14, 16. The deep trench isolation region 18 may be formed by patterning trenches with lithography and etching processes, depositing a dielectric material, such as silicon dioxide, into the trenches, planarizing the dielectric material with chemical-mechanical polishing to remove topography, and recessing the dielectric material to reveal the fins 14, 16 and to form the shallow trench isolation 19 in the active region 12 between the fins 14, 16.

The substrate 20 may contain a monocrystalline or single-crystal semiconductor material, such as single-crystal silicon, and may be a bulk wafer containing a single-crystal semiconductor material (e.g., single-crystal silicon). The semiconductor material of the substrate 20 may be doped with a dopant, such as a p-type dopant.

The fins 14, 16 are formed over the active region 12 and project from a top surface of the substrate 20. The fins 14, 16 may contain a single-crystal semiconductor material, such as single-crystal silicon. The fins 14, 16 may be patterned from the substrate 20 or a layer epitaxially grown on the substrate 20 using lithography and etching processes. The fins 14, 16 may be cut to length when the trenches for the deep trench isolation region 18 are formed. The fins 14 are longer than the fins 16 in a longitudinal direction. Each of the fins 14 extends axially along a longitudinal axis 15, and each of the fins 16 extends axially along a longitudinal axis 17. The number of fins 14 and the number of fins 16 may vary from the numbers in the representative embodiment.

The active region 12 includes a peripheral section 22, a peripheral section 24, and a central section 26 laterally arranged between the peripheral section 22 and the peripheral section 24. The peripheral section 22 of the active region 12 is appended to and projects away from a side edge 25 of the central section 26 of the active region 12. The peripheral section 24 of the active region 12 is appended to and projects away from a side edge 27 of the central section 26 of the active region 12 that is opposite to the side edge 25. The central section 26 of the active region 12 also has opposite side edges 23, 29 that join the opposite side edges 25, 27 and that may be oriented transverse to the side edges 25, 27. The deep trench isolation region 18 defines a boundary, which includes the side edges 23, 25, 27, 29 and the edges extending about the peripheral sections 22, 24, that extends about the perimeter of the sections 22, 24, 26 of the active region 12. The sections 22, 24, 26 are integral and continuous.

The peripheral section 22 has a width dimension, W1, and a length dimension, L1, in a direction transverse to the width dimension and parallel to the side edge 25. The peripheral section 24 has a width dimension, W2, and a length dimension, L2, in a direction transverse to the width dimension and parallel to the side edge 27. The length dimensions of the peripheral sections 22, 24 of the active region 12 may be equal or substantially equal. Alternatively, the length dimensions of the peripheral sections 22, 24 of the active region 12 may be unequal.

The central section 26 has a width dimension, W3, and a length dimension, L3, in a direction transverse to the width dimension and parallel to the side edges 25, 27. The length dimension of the central section 26 of the active region 12 is greater than the length dimension of the peripheral section 22 and is also greater than the length dimension of the peripheral section 24. The active region 12 has a total width equal to the sum of the individual widths of the sections 22, 24, 26. In an embodiment, the width dimensions of the peripheral sections 22, 24 of the active region 12 may be less than the width dimension of the central section 26 of the active region 12. The length dimension of the side edges 25, 27 of the central section 26 is greater than the width dimension of the side edge 23 or the width dimension of the side edge 29.

The fins 14 are arranged with a spaced-apart parallel relationship and extend axially along their respective longitudinal axes 15 over the peripheral sections 22, 24 and the central section 26 of the active region 12. The fins 14 extend in one direction along their respective longitudinal axes 15 beyond the side edge 25 of the central section 26 of the active region 12 onto the peripheral section 22. The fins 14 also extend in the opposite direction along their respective longitudinal axes 15 beyond the side edge 27 of the central section 26 of the active region 12 onto the peripheral section 24. The fins 14 may have a length equal or substantially equal to a sum of the widths of the sections 22, 24, 26 of the active region 12 and, as a result, are longer than the fins 16. The fins 14 are arranged between a set of fins 16 and another set of fins 16 in a direction transverse to the longitudinal axes 15, 17.

The fins 16 are also arranged with a spaced-apart relationship and extend axially along their respective longitudinal axes 17 only over the central section 26 of the active region 12. More specifically, the fins 16 extend axially along their respective longitudinal axes 17 from the side edge 25 of the central section 26 of the active region 12 to the side edge 27 of the central section 26 of the active region 12. The fins 16 may have a length equal to the width of the central section 26 of the active region 12.

The active region 12 is effective enlarged by the addition of the peripheral sections 22, 24 to the central section 26. The layout including the peripheral sections 22, 24 of the active region 12 and the sections of the fins 14 on the peripheral sections 22, 24 of the active region 12 locally enhances heat sinking, when the structure 10 is powered during operation, over only a portion of the structure 10 that is normally at the highest operating temperature. The result is a lowering of the temperature of the structure 10 proximate to the central location of the peripheral sections 22, 24, which may operate to improve the overall temperature uniformity of the structure 10.

Figure 3:
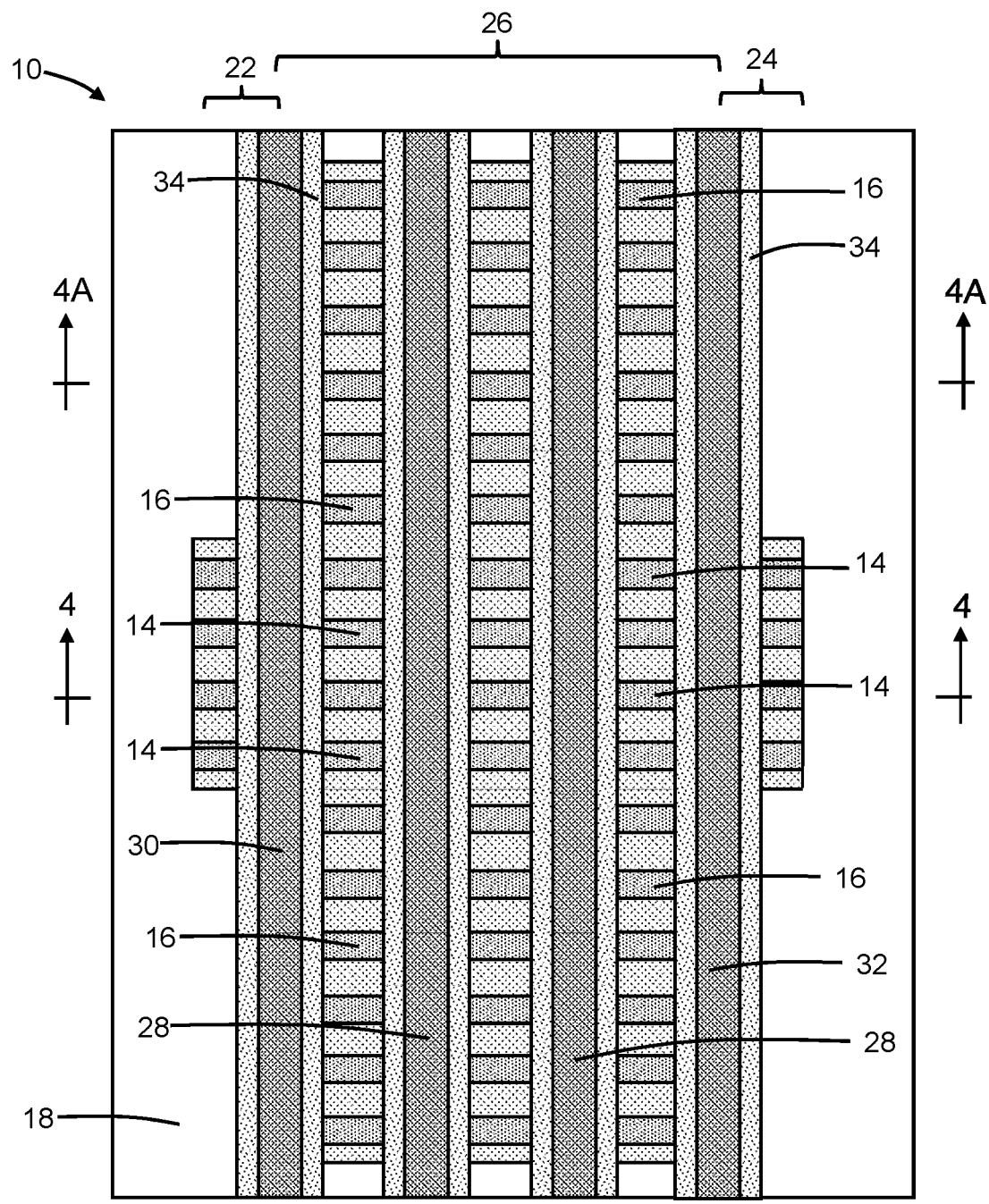
FIG. 3 is a top view of the non-volatile memory structure at a processing stage of the processing method subsequent to FIG. 1.
Figure 4:
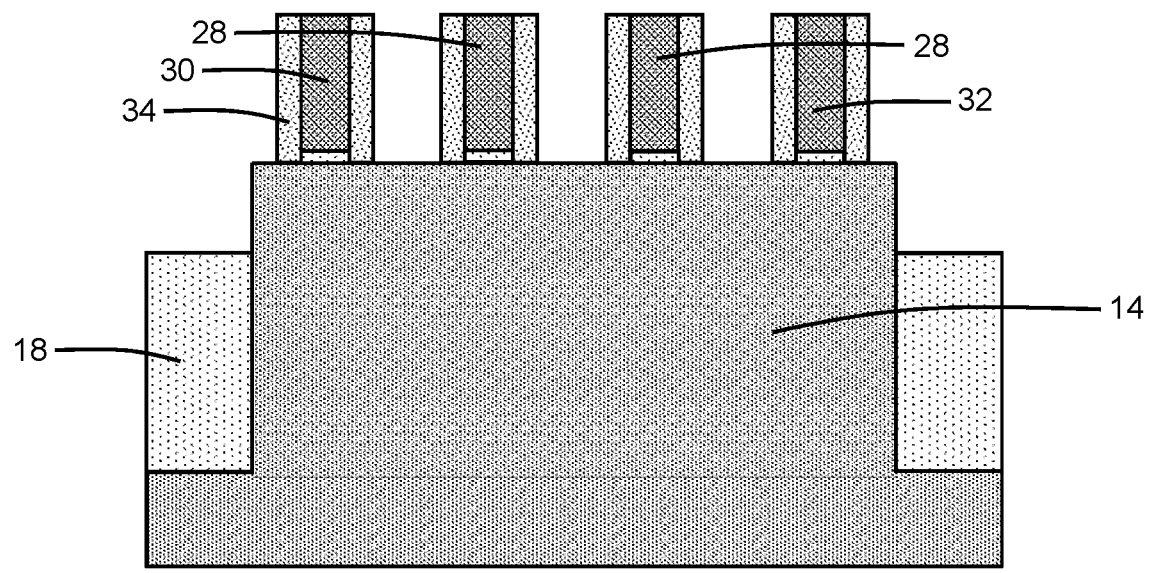
FIG. 4 is a cross-sectional view taken generally along line 4-4 in FIG. 3.
Figure 4A:
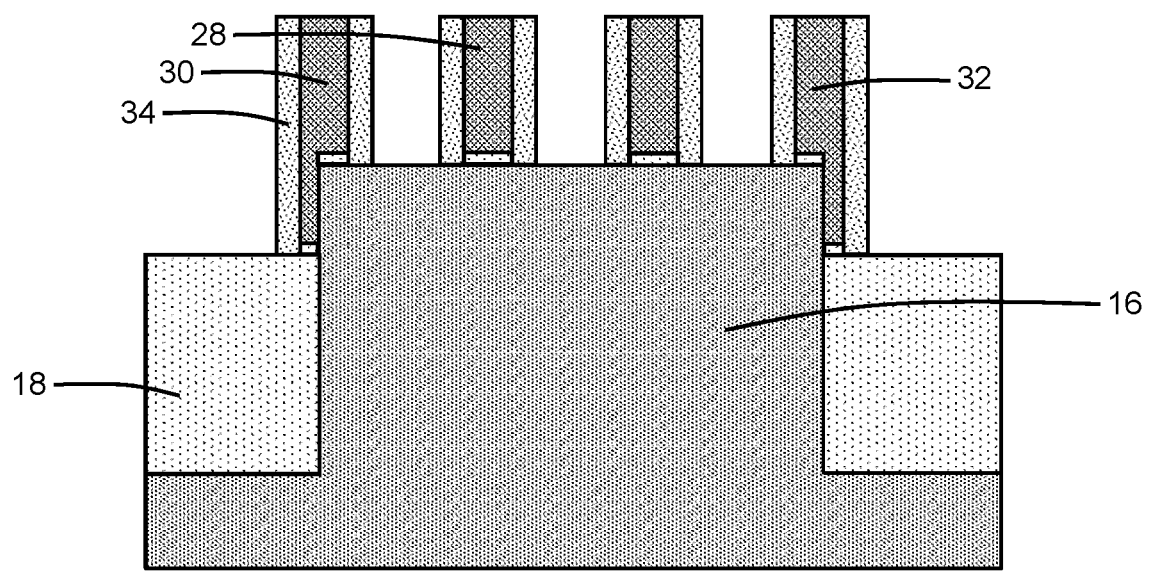
FIG. 4A is a cross-sectional view taken generally along line 4A-4A in FIG. 3.

With reference to FIGS. 3, 4, 4A in which like reference numerals refer to like features in FIGS. 1, 2 and at a subsequent fabrication stage of the processing method, gate structures 28, 30, 32 are formed that extend transversely in a direction transverse to the longitudinal axes 15, 17 across the fins 14, 16. The gate structures 28 are laterally arranged between the gate structure 30 and the gate structure 32. The gate structures 28, 30, 32 may include a gate electrode layer comprised of a conductor, such as a work function metal, and a gate dielectric layer comprised of an electrical insulator, such as hafnium oxide. The gate structures 28, 30, 32 may be formed by depositing a layer stack of their constituent materials and patterning the layer stack with lithography and etching processes. Each gate structure 28, 30, 32 may include a cap (not shown) comprised of a dielectric material, such as silicon nitride, that may be a remnant of the patterning. Sidewall spacers 34 may be formed adjacent to the sidewalls of each of the gate structures 28, 30, 32. The sidewall spacers 34 may be formed by depositing a conformal layer comprised of a dielectric material, such as silicon nitride, and etching the conformal layer with a reactive ion etching process.

Due to their extended length, the fins 14 extend along their longitudinal axes 15 beneath the gate structure 30 in the peripheral section 22 and beneath the gate structure 32 in the peripheral section 24. In an embodiment, the fins 14 may extend along their longitudinal axes 15 fully beneath the gate structure 30 in the peripheral section 22 and fully beneath the gate structure 32 in the peripheral section 24. In an embodiment, the fins 14 may extend longitudinally beyond the gate structure 30 and beyond the gate structure 32. The gate structures 30, 32 may only overlap with and extend transversely across the fins 14, which are longer than the fins 16, at the opposite side edges 25, 27 (FIG. 1) of the central section 26 of the active region 12. The gate structures 30, 32 do not overlap with or extend transversely across the fins 16.

Figure 5:
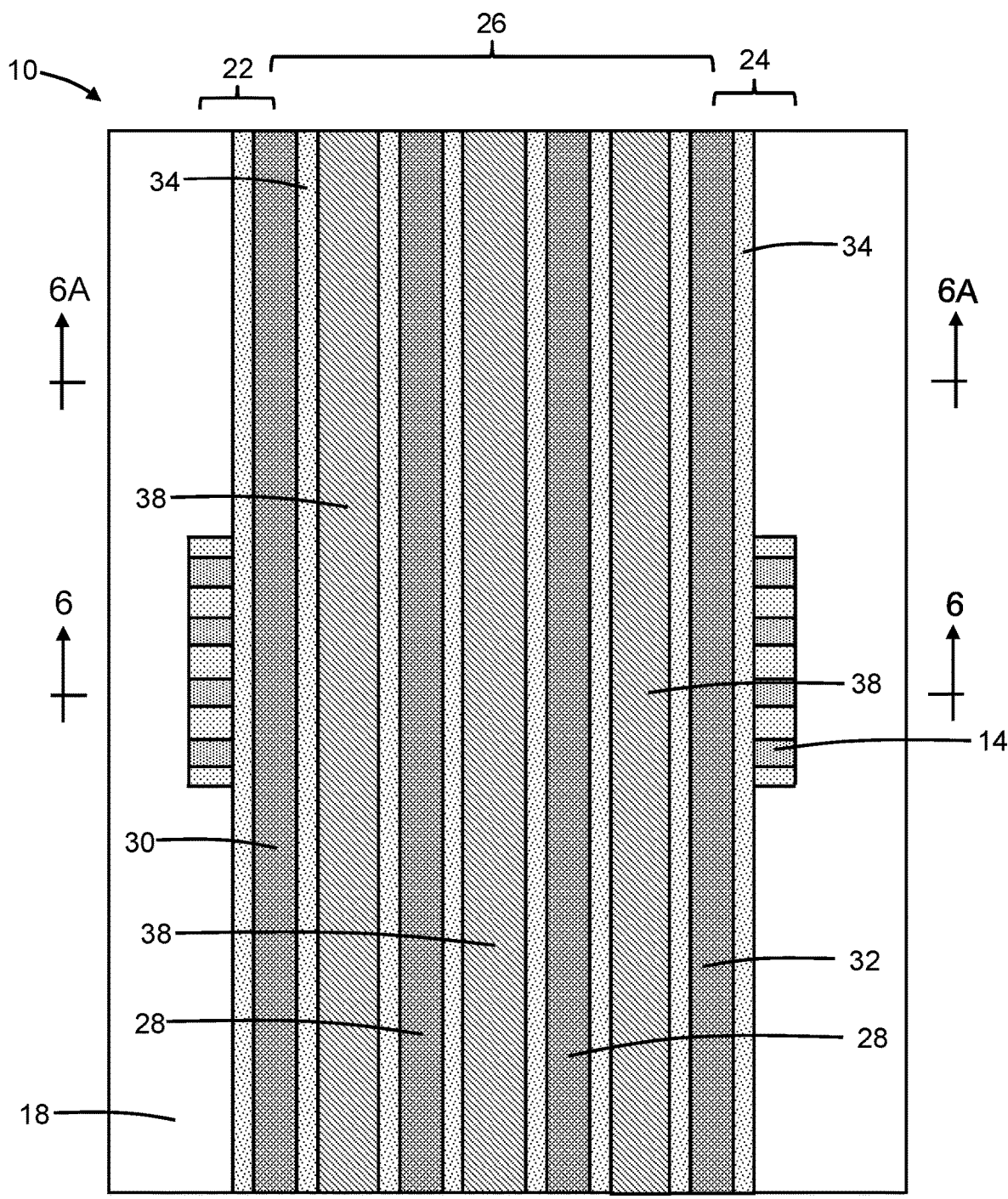
FIG. 5 is a top view of the non-volatile memory structure at a processing stage of the processing method subsequent to FIG. 3.
Figure 6:
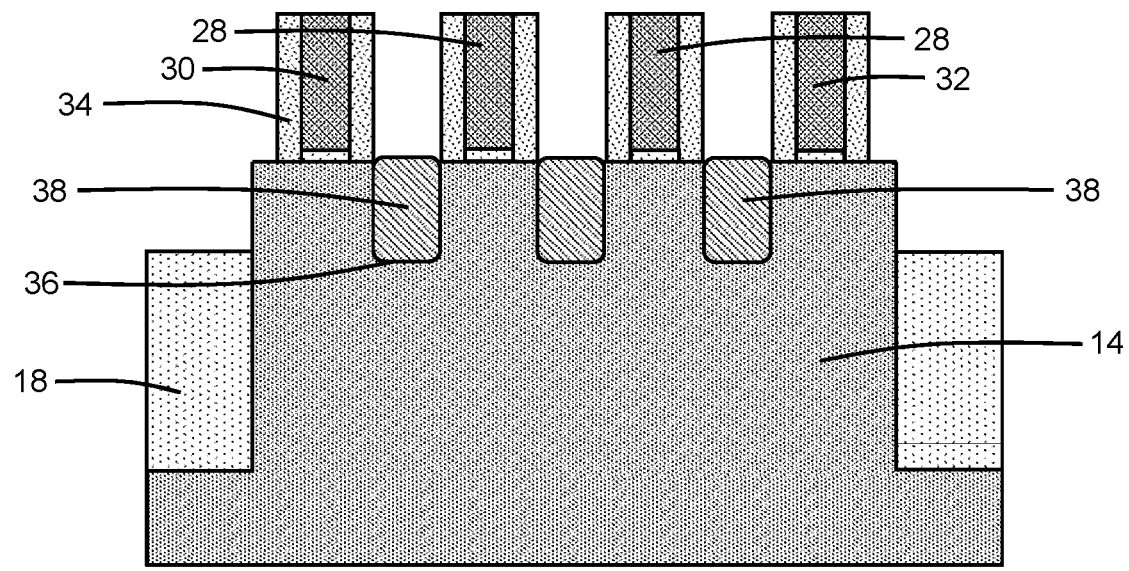
FIG. 6 is a cross-sectional view taken generally along line 6-6 in FIG. 5.
Figure 6A:
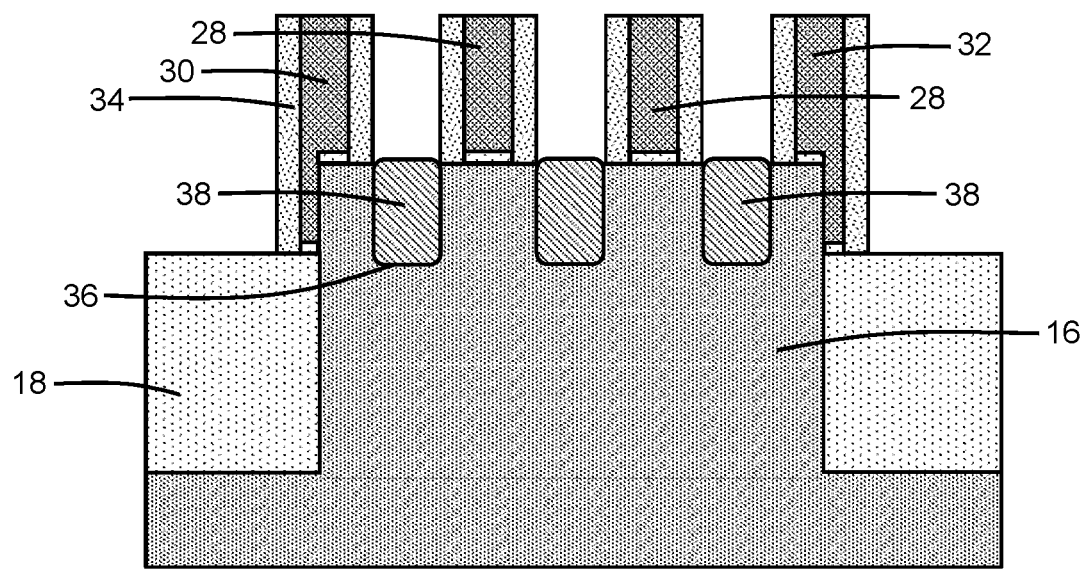
FIG. 6A is a cross-sectional view taken generally along line 6A-6A in FIG. 5.

With reference to FIGS. 5, 6, 6A in which like reference numerals refer to like features in FIGS. 3, 4, 4A and at a subsequent fabrication stage of the processing method, cavities 36 are formed in the fins 14 and the fins 16 by an etching process, such as an anisotropic etching process (e.g., reactive ion etching). A layer 38 of a semiconductor material is epitaxially grown that includes sections that merge in each space between the gate structures 28, 30, 32 to form integral features on the fins 14, 16. The semiconductor layer 38 may be in situ doped during epitaxial growth to introduce an n-type dopant (e.g., phosphorus and/or arsenic) to provide n-type electrical conductivity. The different sections of the semiconductor layer 38 may define source/drain regions of the structure 10. As used herein, the term "source/drain region" means a doped volume of semiconductor material that can function as either a source or a drain of the structure 10.

Figure 7:
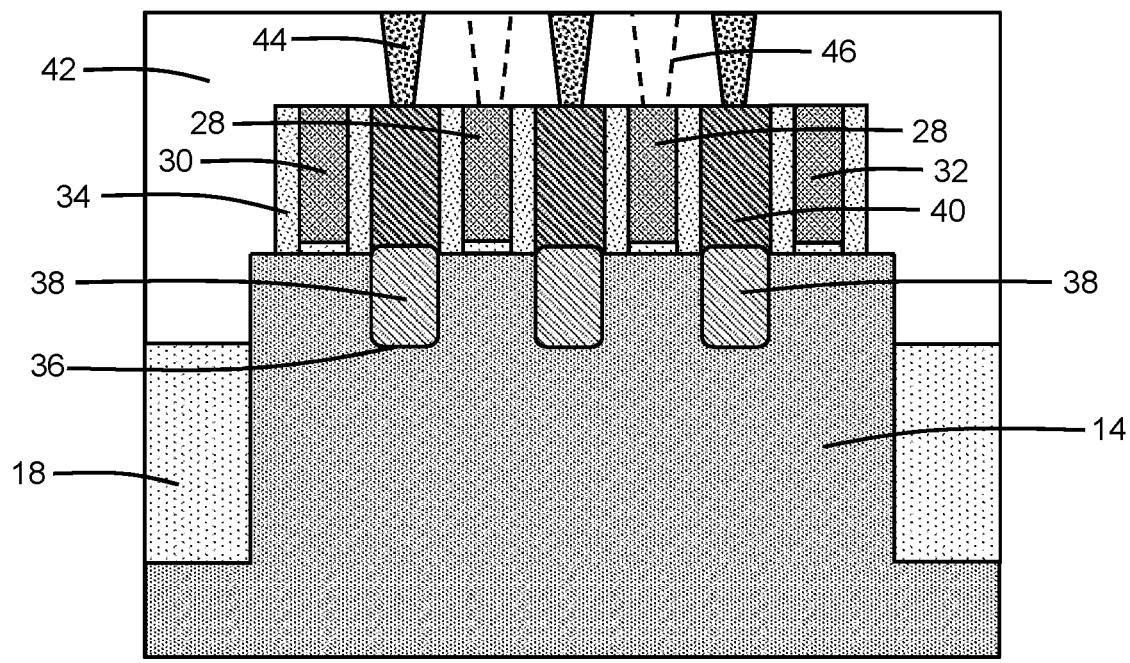
FIGS. 7 and 7A are cross-sectional views of the non-volatile memory structure at a processing stage of the processing method subsequent to FIGS. 6 and 6A.
Figure 7A:
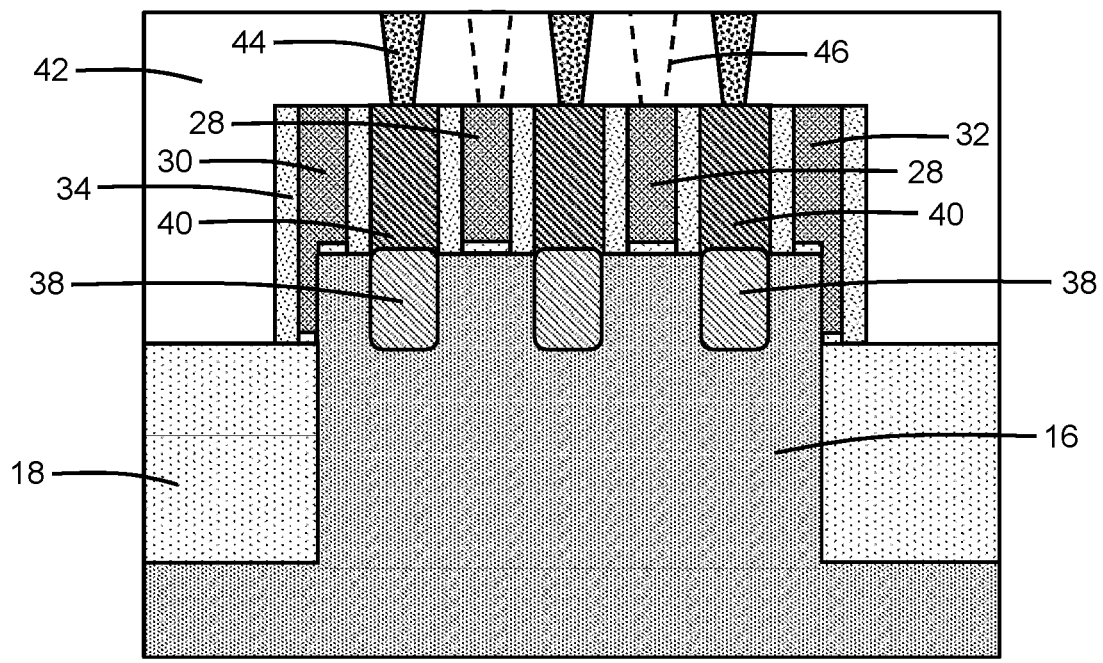

With reference to FIGS. 7, 7A, in which like reference numerals refer to like features in FIGS. 6, 6A and at a subsequent fabrication stage of the processing method, middle-of-line (MOL) processing and back-end-of-line (BEOL) processing follow, which includes formation of silicide, contacts, vias, and wiring for an interconnect structure that is coupled with the structure 10. In particular, trench silicide contacts 40 may be formed that extend to physically and electrically contact the respective sections of the semiconductor layer 38. The trench silicide contacts 40 may contain a metal silicide, such as tungsten silicide, titanium silicide, nickel silicide, or cobalt silicide, formed by a silicidation process. Contacts 44 may be formed in a dielectric layer 42 of the interconnect structure that are connected to the trench silicide contacts 40. Contacts 46 may be formed in the dielectric layer 42 of the interconnect structure that are connected to the gate structures 28. The contacts 44, 46 may be comprised of tungsten that is deposited and planarized by chemical-mechanical polishing. The contacts 46 may be arranged at one connected-together end of the gate structures 28.

The gate structures 30, 32 are not contacted and are electrically inactive. For that reason, the gate structures 30, 32 provide dummy gates that are neither powered nor functional during operation. The dummy gate defined by the gate structure 30 extends across the ends of the fins 14 and the peripheral section 22 of the active region 12, and the dummy gate defined by the gate structure 32 extends across the opposite ends of the fins 14 and the peripheral section 24 of the active region 12.

Figure 8:
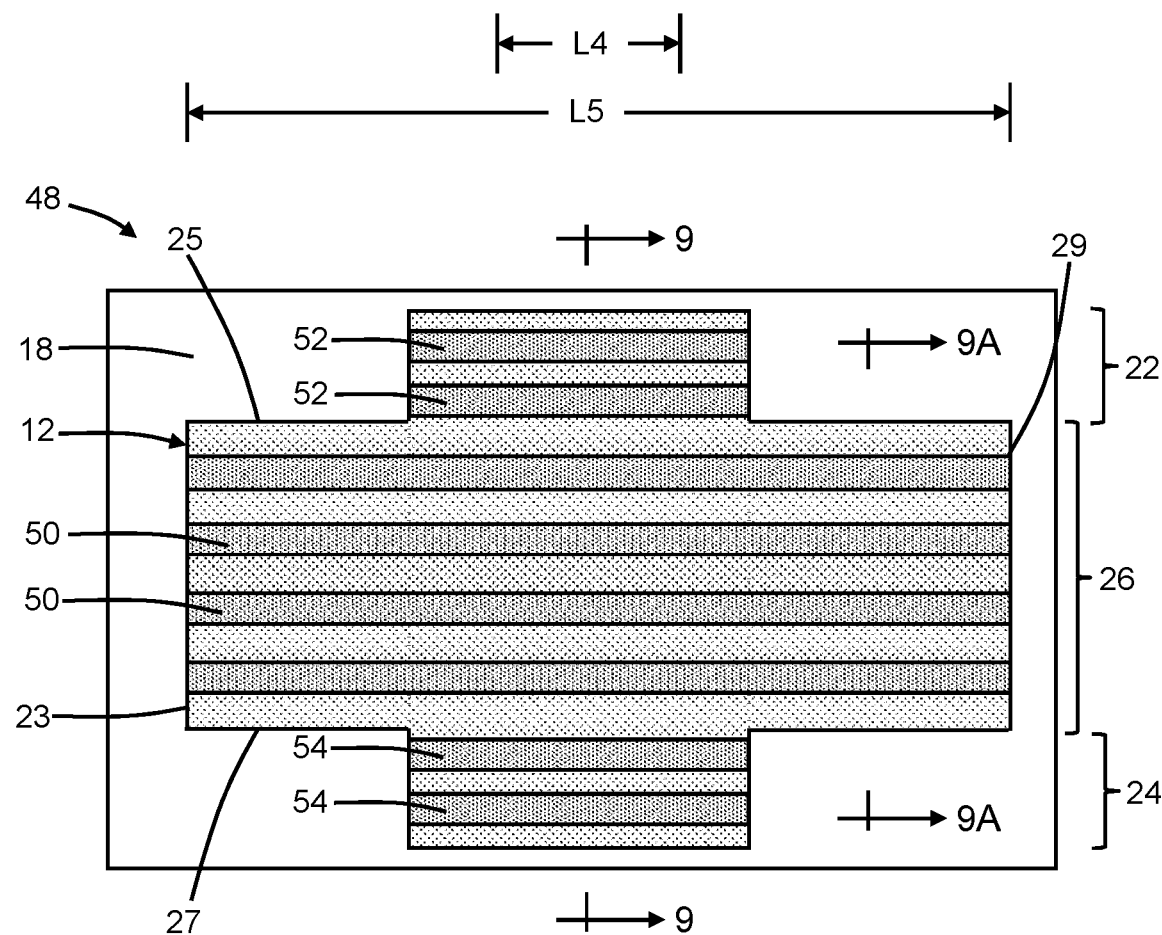
FIG. 8 is a top view of a non-volatile memory structure at an initial stage of a processing method in accordance with alternative embodiments of the invention.
Figure 9:
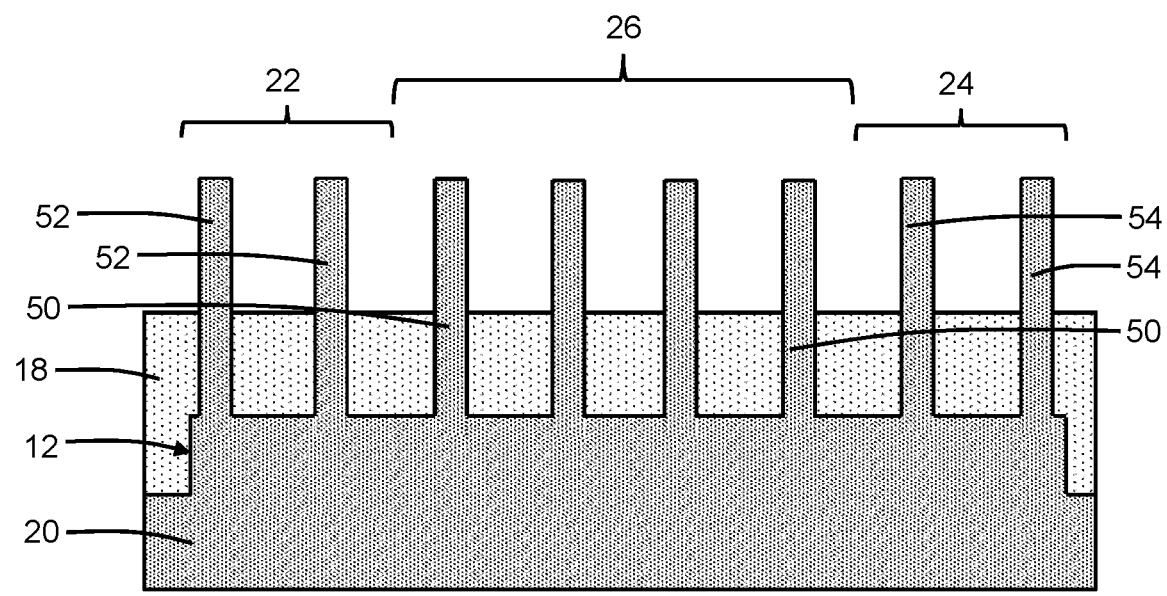
FIG. 9 is a cross-sectional view taken generally along line 9-9 in FIG. 8.
Figure 9A:
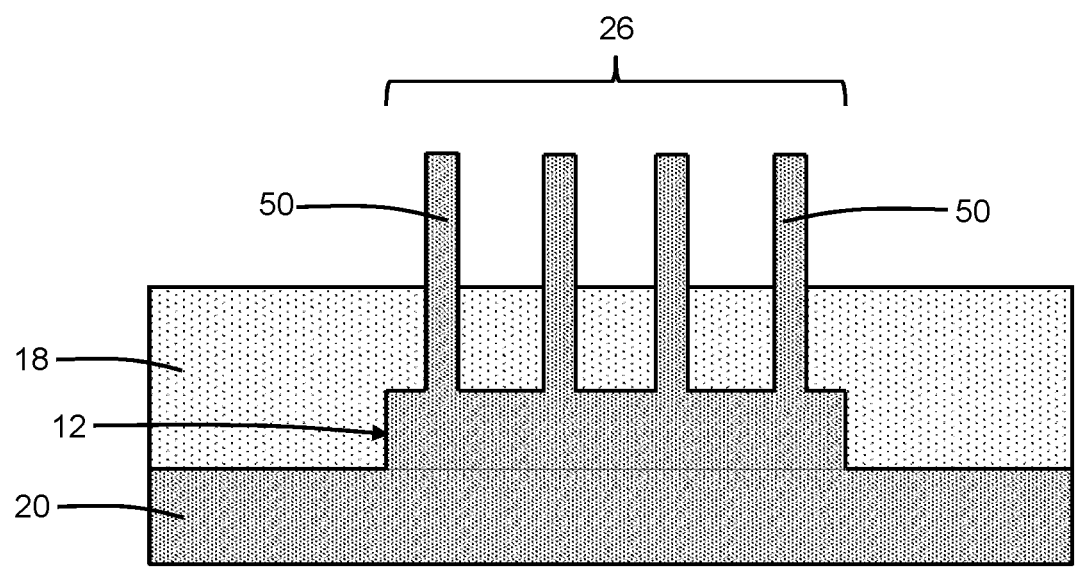
FIG. 9A is a cross-sectional view taken generally along line 9A-9A in FIG. 8.

With reference to FIGS. 8, 9, 9A and in accordance with alternative embodiments, a structure 48 includes fins 50, fins 52, and fins 54 that are arranged on the active region 12. The fins 50 are located on the substrate 20 within the central section 26 of the active region 12. The fins 52 are located on the substrate 20 within the peripheral section 22 of the active region 12. The fins 54 are located on the substrate 20 within the peripheral section 24 of the active region 12. The fins 50 are laterally arranged between the fins 52 and the fins 54. The peripheral sections 22, 24 of the active region 12 and the fins 52, 54 absorb excess heat and therefore reduce statistical variation in the memory elements of the structure 10.

Figure 10:
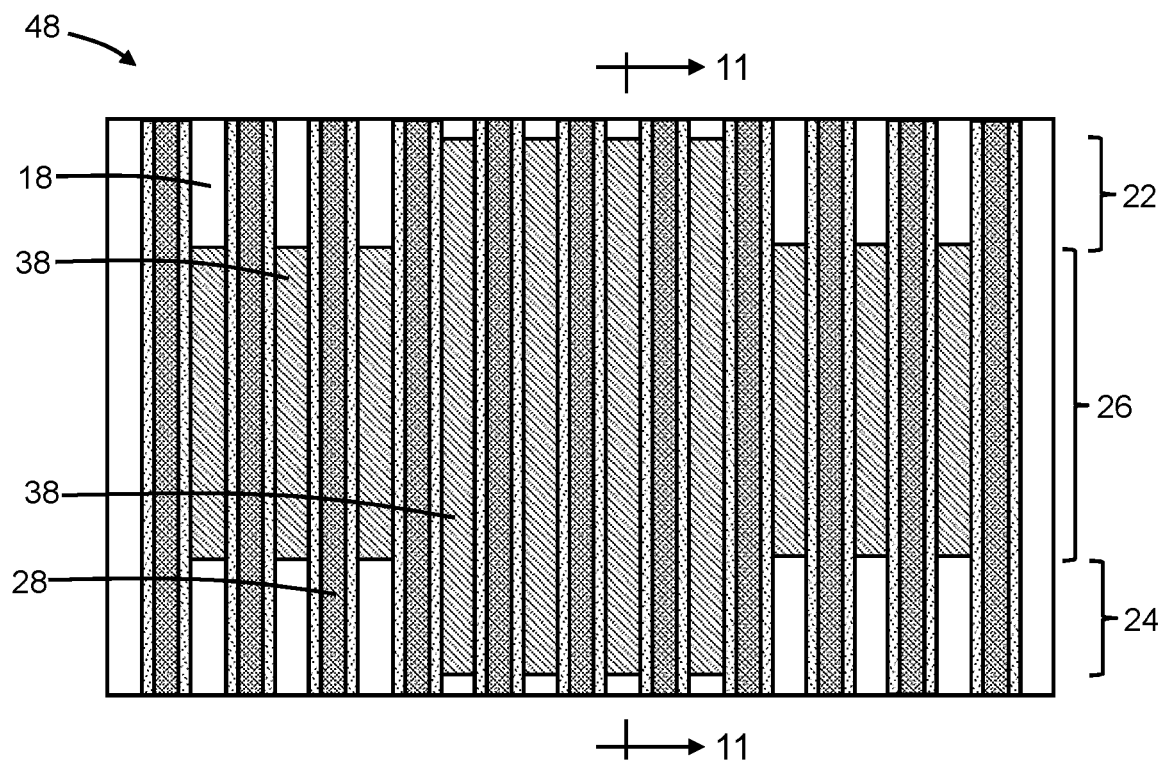
FIG. 10 is a top view of the non-volatile memory structure at a processing stage of the processing method subsequent to FIG. 8.
Figure 11:
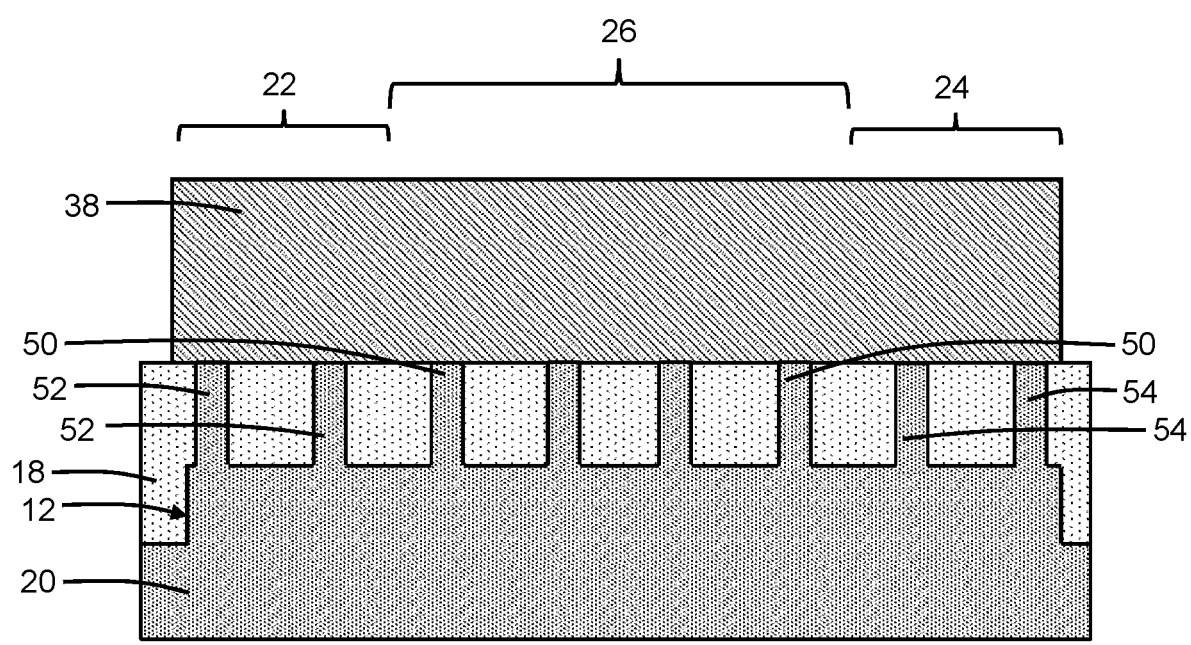
FIG. 11 is a cross-sectional view taken generally along line 11-11 in FIG. 10.

With reference to FIGS. 10, 11 in which like reference numerals refer to like features in FIGS. 8, 9, 9A and at a subsequent fabrication stage of the processing method, the gate structures 28 and the sections of the semiconductor layer 38 are formed as previously described. The gate structures 28 extend transversely across the fins 50, 52, 54. The sections of the semiconductor layer 38 are epitaxially grown on the fins 50, 52, 54 in the spaces between the gate structures 28.

Figure 12:
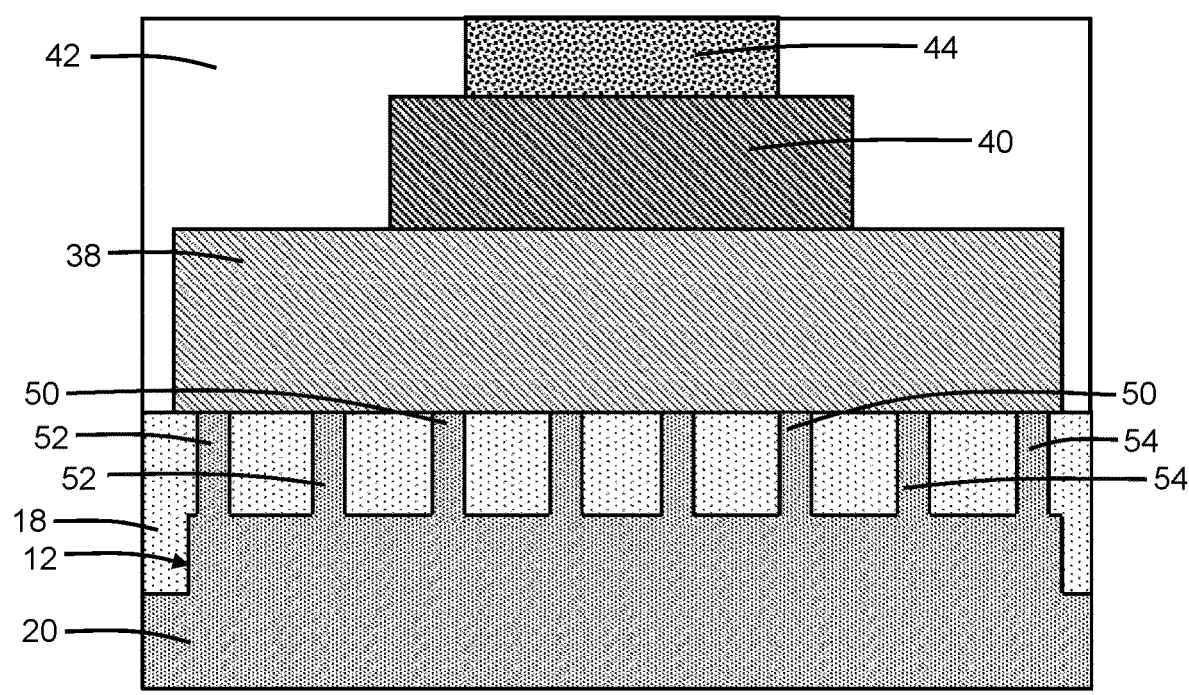
FIG. 12 is a cross-sectional view of the non-volatile memory structure at a processing stage of the processing method subsequent to FIG. 11.

With reference to FIG. 12 in which like reference numerals refer to like features in FIG. 11 and at a subsequent fabrication stage of the processing method, the trench silicide contacts 40 are formed over the sections of the semiconductor layer 38. The trench silicide contacts 40 are shorter in length than the sections of the semiconductor layer 38. The trench silicide contacts 40 may be positioned over and in physical contact with only the portions of the semiconductor layer 38 on fins 50. The localization of the trench silicide contacts 40 may be achieved by controlling the size of the trenches in which the silicide is formed. The portions of the semiconductor layer 38 on fins 52 and the portions of the semiconductor layer 38 on fins 54 are not in physical contact with the trench silicide contacts 40. The contacts 44 connected to the trench silicide contacts 40 are then formed in the dielectric layer 42 of the interconnect structure. These fins 52, 54 are not contacted by the trench silicide contacts 40 or contacts 44 and, therefore, represent dummy fins that are electrically inactive.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
a substrate including an active region, the active region including a first section having a first side edge and a second side edge opposite to the first side edge, a second section extending laterally from the first side edge, and a third section extending laterally from the second side edge, the second section of the active region centered along the first side edge of the first section of the active region, the first section having a first length dimension in a direction parallel to the first side edge, the second section having a second length dimension in the direction parallel to the first side edge, and the second length dimension less than the first length dimension;
a first fin positioned on the substrate in the first section of the active region, the second section of the active region, and the third section of the active region; and
a first gate structure that extends over the first fin and the second section of the active region.

2. The structure of claim 1 wherein the third section of the active region has a third length dimension in a direction parallel to the second side edge, and the third length dimension is less than the first length dimension.

3. The structure of claim 2 wherein the third section of the active region is centered along the second side edge of the first section of the active region.

4. The structure of claim 1 further comprising:
a second gate structure that extends across the first fin and the third section of the active region.

5. The structure of claim 1 further comprising:
a plurality of second fins positioned on the substrate in the first section of the active region,
wherein the first fin has a first length, and the plurality of second fins have a second length that is less than the first length.

6. The structure of claim 1 wherein the first fin has a longitudinal axis, and the first fin extends along the longitudinal axis fully beneath the first gate structure.

7. The structure of claim 6 wherein the first fin extends along the longitudinal axis beyond the first gate structure.

8. The structure of claim 1 further comprising:
a trench isolation region in the substrate, the trench isolation region defining a boundary for the active region.

9. A structure comprising:
a substrate including an active region, the active region including a first section having a first side edge and a second section extending laterally from the first side edge, the first section having a first length dimension in a direction parallel to the first side edge, the second section having a second length dimension in the direction parallel to the first side edge, and the second length dimension less than the first length dimension;
a first fin positioned on the substrate in the second section of the active region;
a plurality of second fins on the substrate in the first section of the active region; and
a first gate structure that extends over the first fin, the plurality of second fins, and the second section of the active region;
a semiconductor layer on the first fin and the plurality of second fins; and
a contact coupled with the semiconductor layer,
wherein the contact is positioned over the plurality of second fins and not over the first fin.

10. The structure of claim 9 wherein the active region has a second side edge opposite to the first side edge and a third section extending laterally from the second side edge, the third section has a third length dimension in a direction parallel to the second side edge, and the third length dimension is less than the first length dimension.

11. The structure of claim 10 wherein the second section of the active region is centered along the first side edge of the first section of the active region, and the third section of the active region is centered along the second side edge of the first section of the active region.

12. The structure of claim 10 further comprising:
a third fin positioned on the substrate in the third section of the active region,
wherein the plurality of second fins are laterally arranged between the first fin and the third fin.

13. The structure of claim 12 wherein the first gate structure extends across the third section of the active region and the third fin.

14. The structure of claim 9 wherein the first fin has a first length, and the plurality of second fins have a second length that is greater than the first length.

15. The structure of claim 9 wherein the second section of the active region is centered along the first side edge of the first section of the active region.

16. The structure of claim 9 further comprising:
a trench isolation region in the substrate, the trench isolation region defining a boundary for the active region.

17. The structure of claim 9 further comprising:
a second gate structure that extends across the first section of the active region and the plurality of second fins.

18. A method comprising:
forming a trench isolation region in a substrate to define a boundary for an active region, wherein the active region includes a first section having a first side edge and a second side edge opposite to the first side edge, a second section extending laterally from the first side edge, and a third section extending laterally from the second side edge, the second section of the active region is centered along the first side edge of the first section of the active region, the first section has a first length dimension in a direction parallel to the first side edge, the second section has a second length dimension in the direction parallel to the first side edge, and the second length dimension is less than the first length dimension;
forming a first fin positioned on the substrate in the first section of the active region, the second section of the active region, and the third section of the active region; and
forming a first gate structure that extends over the first fin and the second section of the active region.

19. The method of claim 18 wherein the third section of the active region has a third length dimension in a direction parallel to the second side edge, and the third length dimension is less than the first length dimension.

20. The method of claim 18 further comprising:
 forming a second gate structure that extends over the first fin and the third section of the active region.

\* \* \* \* \*